(12) United States Patent
Inoue

(10) Patent No.: US 8,575,701 B1
(45) Date of Patent: Nov. 5, 2013

(54) SEMICONDUCTOR DEVICE WHERE LOGIC REGION AND DRAM ARE FORMED ON SAME SUBSTRATE

(75) Inventor: Ken Inoue, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 474 days.

(21) Appl. No.: 12/685,413

(22) Filed: Jan. 11, 2010

Related U.S. Application Data

(60) Provisional application No. 61/144,170, filed on Jan. 13, 2009.

(51) Int. Cl.
*H01L 29/78* (2006.01)
(52) U.S. Cl.
USPC .......................................... 257/368; 257/392
(58) Field of Classification Search
USPC .................. 257/368, 392, E27.062, E27.072
See application file for complete search history.

(56) References Cited

U.S. PATENT DOCUMENTS

| 5,972,764 | A | * | 10/1999 | Huang et al. | 438/305 |
| 6,108,229 | A | | 8/2000 | Shau | |
| 6,815,281 | B1 | * | 11/2004 | Inoue et al. | 438/200 |
| 2003/0027389 | A1 | * | 2/2003 | Yi et al. | 438/257 |

* cited by examiner

*Primary Examiner* — Tran Tran
(74) *Attorney, Agent, or Firm* — Young & Thompson

(57) ABSTRACT

A semiconductor device having a DRAM region and a logic region embedded therein, includes: a substrate having the DRAM region and the logic region respectively formed thereon; a first transistor formed in the DRAM region, and having a first gate insulating film, and a second transistor formed in the logic region, and having a second gate insulating film, wherein equivalent oxide thickness T1 of the first gate insulating film of the first transistor is not larger than equivalent oxide thickness T2 of the second gate insulating film of the second transistor, the second transistor formed in the logic region has a pocket region which contains an impurity ion having a conductivity type different from that of an impurity ion composing the source/drain regions, while the first transistor formed in the DRAM region has no pocket region.

14 Claims, 5 Drawing Sheets

SEMICONDUCTOR DEVICE WHERE LOGIC REGION AND DRAM ARE FORMED ON SAME SUBSTRATE

BACKGROUND

1. Technical Field

The present invention relates to a semiconductor device (embedded DRAM) having a DRAM region and a logic region embedded therein.

2. Related Art

In a semiconductor device (embedded DRAM) having a DRAM region and a logic region embedded therein, transistors are formed in each of the DRAM region and the logic region so as to be adapted to the individual characteristics. In the conventional DRAM region, it has been necessary to make the gate insulating film thicker, in order to achieve a high breakdown voltage.

The cells are, however, desired to be shrunk, for the purpose of increasing the memory capacity and reducing the cost. For this purpose, the gate length L and the gate width W of the cell transistors in the DRAM region are desired to be shrunk. On the other hand, it may be necessary to thin the gate insulating film (reduction in the equivalent oxide thickness (EOT)) in order to downsize the gates of the cell transistors in the DRAM region.

U.S. Pat. No. 6,108,229 describes that the switching transistors of memory cells and logic transistors in the peripheral logic circuit have the same gate insulating film. In the invention described in this literature, the switching transistors of the memory cells and the logic transistors in the peripheral logic circuit are made equal also in the threshold voltage. Prior art described in this literature relates to an exemplary process of adding a step of masking, for the purpose of equalizing the thickness of the gate insulating films of the switching transistors of the memory cells and the logic transistors in the peripheral circuit, while making difference only in the threshold voltage (Table 1).

Further, U.S. Pat. No. 6,815,281 describes a configuration in which silicide is formed in the logic portion and the memory cell portion.

However, shrinkage in the gate size of the cell transistors in the DRAM region, and consequent adjustment of the thickness of the gate insulating film nearly equal to the thickness of the gate insulating film of the logic transistors, have raised problems of increase in $I_{off}$ (degradation in retention characteristics) and lowering in the breakdown voltage. For example, it is described also in U.S. Pat. No. 6,108,229 that adoption of the same configuration both by the switching transistors in the memory cells and the logic transistors in the peripheral logic circuit increases leakage current from the switching transistors in the memory cells, so that it is necessary to provide a self-refresh mechanism, an error code checking (ECC) and a correction means (column 24, lines 31 to 52).

SUMMARY OF THE INVENTION

According to the present invention, there is provided a semiconductor device having a DRAM region and a logic region embedded therein, which includes:

a substrate having the DRAM region and the logic region respectively formed thereon;

a first transistor formed in the DRAM region, and having a first gate insulating film; and a second transistor formed in the logic region, and having a second gate insulating film, wherein equivalent oxide thickness T1 of the first gate insulating film of the first transistor is not larger than equivalent oxide thickness T2 of the second gate insulating film of the second transistor, the second transistor formed in the logic region has, at each end of the source/drain regions thereof, a pocket region which contains an impurity ion having a conductivity type different from that of an impurity ion composing the source/drain regions, and the first transistor formed in the DRAM region has no pocket region formed at each end of the source/drain regions thereof.

According to the present invention, there is provided also a semiconductor device having a DRAM region and a logic region embedded therein, which includes:

a substrate having the DRAM region and the logic region respectively formed thereon;

a first transistor formed in the DRAM region, and having a first gate insulating film; and a second transistor formed in the logic region, and having a second gate insulating film, wherein equivalent oxide thickness T1 of the first gate insulating film of the first transistor is smaller than 2.2 nm, the second transistor formed in the logic region has, at each end of the source/drain regions thereof, a pocket region which contains an impurity ion having a conductivity type different from that of an impurity ion composing the source/drain regions, and the first transistor formed in the DRAM region has no pocket region formed at each end of the source/drain regions thereof.

The present inventors found out that, by configuring the first transistor to have no pocket region, $I_{off}$ may successfully be lowered even if the equivalent oxide thickness T1 of the first gate insulating film of the first transistors in the DRAM region is thinned to fall in the above-described range. In this way, the first transistor can keep retention characteristics necessary for DRAM.

According to the present invention, there is provided still also a semiconductor device having a DRAM region and a logic region embedded thereon, which includes:

a substrate having the DRAM region and the logic region respectively formed therein;

a first transistor formed in the DRAM region, and having a first gate insulating film; and a second transistor formed in the logic region, and having a second gate insulating film, wherein equivalent oxide thickness T1 of the first gate insulating film of the first transistor is not larger than equivalent oxide thickness T2 of the second gate insulating film of the second transistor, and the first transistor is configured to be applied with a negative bias voltage in the standby period.

According to the present invention, there is provided still also a semiconductor device having a DRAM region and a logic region embedded therein, which includes:

a substrate having the DRAM region and the logic region respectively formed thereon;

a first transistor formed in the DRAM region, and having a first gate insulating film; and a second transistor formed in the logic region, and having a second gate insulating film, wherein equivalent oxide thickness T1 of the first gate insulating film of the first transistor is smaller than 2.2 nm, and the first transistor is configured to be applied with a negative bias voltage in the standby period.

The present inventors found out that, by configuring the first transistor to be applied with a negative bias voltage in the standby period, the word-line voltage may be reduced, and thereby also the voltage applied to the first gate insulating film may be reduced. Accordingly, a sufficient level of breakdown voltage may be ensured even if the equivalent oxide thickness T1 of the first gate insulating film of the first transistor in the DRAM region is thinned to fall in the above-described range. By virtue of this configuration, also the word-line voltage in the peripheral circuit in the DRAM region may be reduced.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1A:
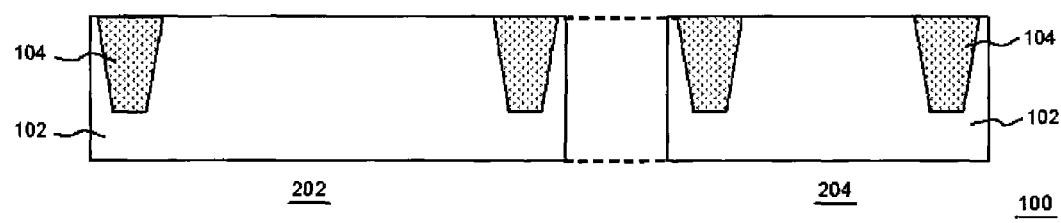
FIG. 1A to FIG. 4B are sectional views illustrating exemplary procedures of manufacturing a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described below referring to the attached drawings. Note that any similar constituents will be given with similar reference numerals or symbols in all drawings, and explanations therefor will not be repeated.

FIG. 1A to FIG. 4B are sectional views illustrating procedures of manufacturing a semiconductor device 100 of this embodiment. FIG. 5 is a plan view illustrating a configuration of the semiconductor device 100 of this embodiment.

In this embodiment, the semiconductor device 100 is a semiconductor device having a DRAM region 202 which contains DRAM cells, and a logic region 204.

As illustrated in FIG. 5, on a substrate 102 of the semiconductor device 100, the logic region 204 and the DRAM region 202 are provided. In the periphery of the DRAM region 202, there is provided a peripheral circuit region 206 having a logic circuit for driving a DRAM in the DRAM region 202 formed therein. The peripheral circuit region 206 is typically provided with a SA (Sense Amplifier), XDEC (XDecoder), word driver and so forth. In addition, I/O regions 208 are provided in the periphery of the logic region 204 and the peripheral circuit region 206. In this embodiment, the logic region 204 may be configured as a region typically having a high-speed logic circuit and CMOS formed therein, such as CPU (Central Processing Unit).

Figure 4A:
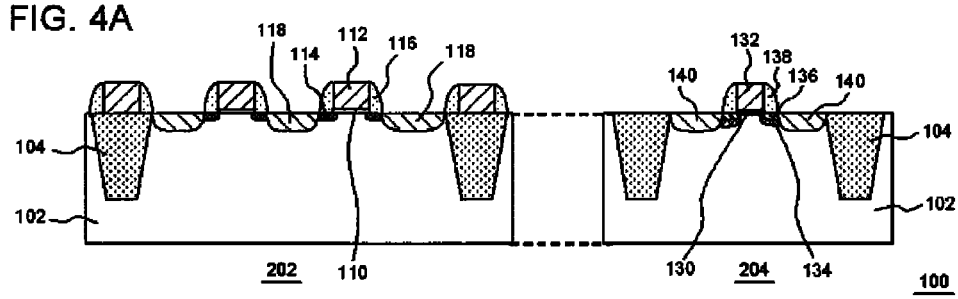
Figure 4B:
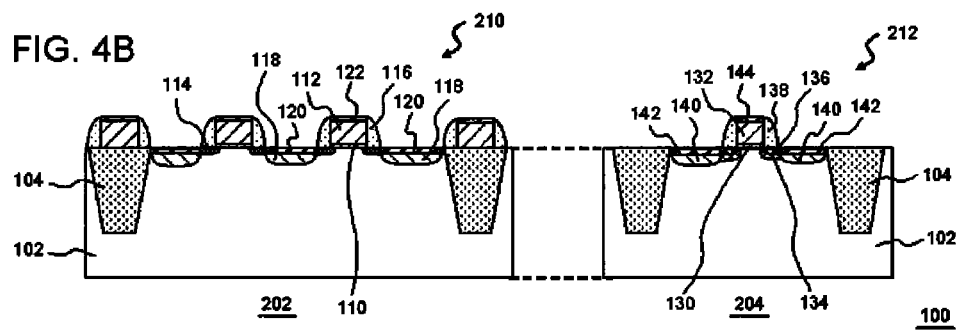
Figure 5:
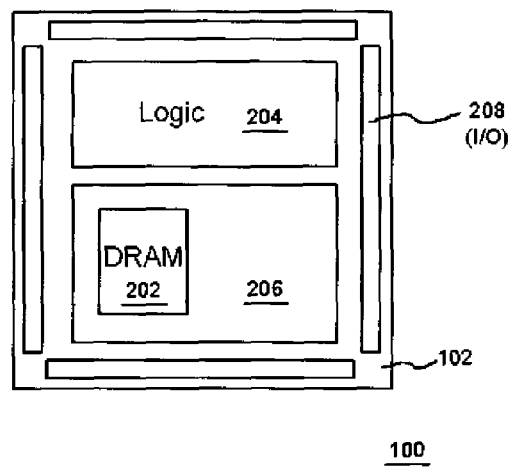
FIG. 5 is a plan view illustrating an exemplary configuration of the semiconductor device according to the embodiment of the present invention.

As illustrated in FIG. 4B, the semiconductor device 100 in this embodiment includes the substrate 102 which have the DRAM region 202 and the logic region 204 respectively formed thereon; first transistor 210 which is formed in the DRAM region 202 and has a first gate insulating film 110; and a second transistor 212 which is formed in the logic region 204 and has a second gate insulating film 130. The substrate 102 is typically a semiconductor substrate such as silicon substrate.

In this embodiment, the first gate insulating film 110 of the first transistor 210 is formed to have a small equivalent oxide thickness (EOT: Equivalent Oxide Thickness) T1 which falls in a predetermined range.

In this embodiment, the thickness of the first gate insulating film 110 may be thinned typically so as to adjust the equivalent oxide thickness T1 of the first gate insulating film 110 of the first transistor 210 in the DRAM region 202 approximately not larger than the equivalent oxide thickness T2 of the second gate insulating film 130 of the second transistor 212 in the logic region 204.

For example, the equivalent oxide thickness (EOT: Equivalent Oxide Thickness) T1 of the first gate insulating film 110 of the first transistor 210 may be set not larger than the equivalent oxide thickness T2 of the second gate insulating film 130 of the second transistor 212.

For example, the equivalent oxide thickness T1 of the first gate insulating film 110 and the equivalent oxide thickness T2 of the second gate insulating film 130 may be adjusted so as to satisfy a relation of $-1$ nM$\leq$T1$-$T2$\leq$1 nm.

For example, the equivalent oxide thickness T1 of the first gate insulating film 110 in this embodiment may be set smaller than 2.2 nm.

In addition, the second transistor 212 in the logic region 204 has extension regions 136 and pocket regions 134, formed under sidewalls 138 and at the ends of the second source/drain regions 140. In the logic region 204, the second transistors 212 are formed to have various gate lengths L and the gate widths W. For this reason, conditions of implanting impurity ions are set so as to satisfy characteristics of the various transistors at the same time. By forming the pocket regions 134 in the logic region 204, a phenomenon, such that the threshold voltage Vt becomes lower as the gate length L becomes thinner, may be suppressed.

On the other hand, the present inventors found out that GIDL (Gate Induced Drain Leakage) and junction leakage may increase and thereby the retention characteristics of the DRAM may largely degrade, if the first gate insulating film 110 of the first transistor 210 is thinned as described in the above, and the pocket regions 134 are formed also in the first transistor 210 similarly to as in the second transistor 212. For this reason, in this embodiment, the first transistor 210 is configured to have no pocket regions 134 under the sidewalls 116 at the ends of first source/drain regions 118.

In addition, the first transistor 210 may be configured so that the first gate electrode 112 is applied with a negative bias voltage in the standby period. The present inventors found out that this configuration may reduce the word-line voltage, and may consequently reduce the maximum voltage applied to the first gate insulating film 110. Accordingly, a sufficient level of breakdown voltage may be ensured, even if the thickness of the first gate insulating film 110 of the first transistor 210 is thinned as descried in the above. In this embodiment, by controlling the dose of impurity ion which is implanted into the channel region in the DRAM region 202 and having the same conductivity type with the substrate 102, the configuration which allows application of a negative bias voltage in the standby period may be obtained. Since the dose of impurity ion in this case may be reduced as compared with a configuration which allows application of zero voltage (0 V) in the standby period, so that also an additional effect of reducing variation in the threshold voltage due to variation in the concentration of impurity ion may be expectable. In this embodiment, the first transistor 210 in the DRAM region 202 may be configured typically so that the first gate electrode 112 is applied with a gate voltage of −1.0 V to −0.1 V or around in the standby period. Further, the first transistor 210 may alternatively be configured so that the first gate electrode 112 is applied with a gate voltage typically smaller than 2.0 V in the operation period. In this embodiment, the DRAM region 202 is provided with a negative bias generating circuit (not illustrated) for applying a negative voltage to the first gate electrode 112 of the first transistor 210.

On the other hand, the second transistor 212 may be configured so that the second gate electrode 132 is applied with zero voltage in the standby period. Accordingly, the second transistor 212 may be formed based on the same conditions in the conventional processes.

Next, procedures of manufacturing of the semiconductor device 100 of this embodiment will be explained, referring to FIG. 1A to FIG. 4B. The description below will deal with the case where the first gate insulating film 110 of the first transistor 210 and the second gate insulating film 130 of the second transistor 212 are configured by the same material having the same thickness. In other words, the description below will explain an exemplary case where the equivalent oxide thickness T1 of the first gate insulating film 110 of the first transistor 210 and the equivalent oxide thickness T2 of the second gate insulating film 130 of the second transistor 212 are equal.

First, on the top surface of the substrate 102 in the DRAM region 202 and the logic region 204, device isolation insulating films (Shallow Trench Isolation; STI) 104 are formed by a publicly-known method (FIG. 1A). In this embodiment, by controlling the dose of impurity ion which is implanted in the channel regions of the DRAM region 202 and having the same conductivity type with the substrate 102, the configuration which allows application of a negative bias voltage in the standby period may be obtained. Since the dose of impurity ion in this case may be reduced as compared with a configuration which allows application of zero voltage (0 V) in the standby period, so that also an additional effect of reducing variation in the threshold voltage due to variation in the concentration of impurity ion may be expectable.

Figure 1B:
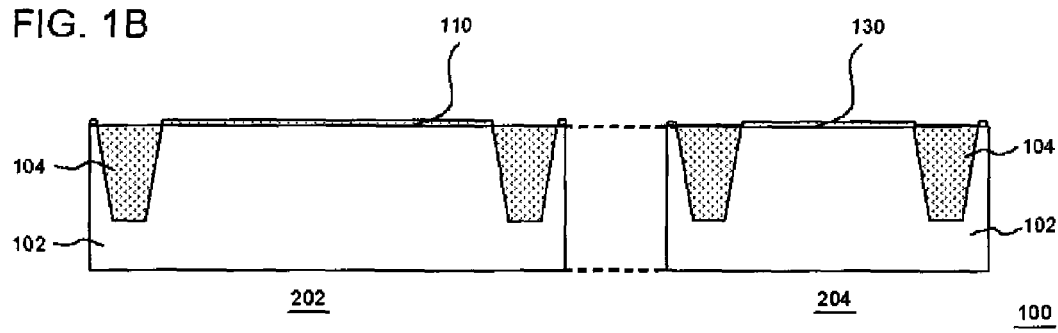

Next, the gate insulating film is formed over the entire surface of the substrate 102. Since the first gate insulating film 110 and the second gate insulating film 130 herein are configured by the same material having the same thickness, they may be formed at the same time. The gate insulating film may typically be a silicon oxide film formed by thermally oxidizing the surface of the substrate 102. As a consequence, the first gate insulating film 110 is formed in the DRAM region 202, and the second gate insulating film 130 is formed in the logic region 204 (FIG. 1B).

Figure 2A:
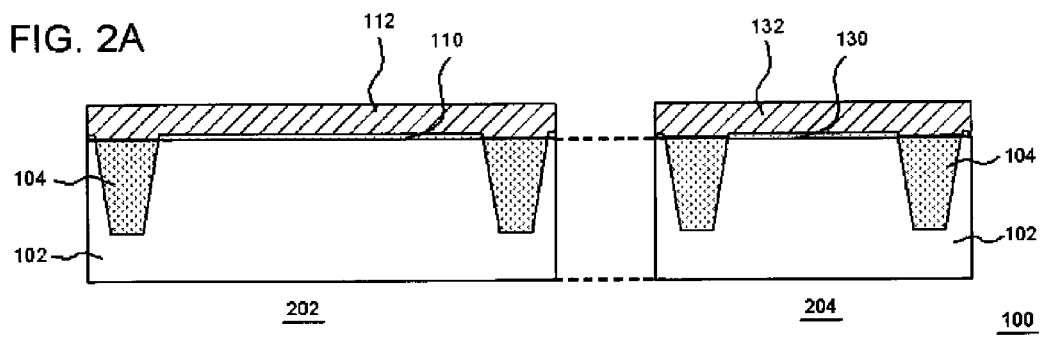

Next, over the entire surface of the substrate 102, an electro-conductive film which will be processed later to give the first gate electrodes 112 and the second gate electrode 132, is formed (FIG. 2A). In this embodiment, the electro-conductive film may typically be composed of polysilicon.

Figure 2B:
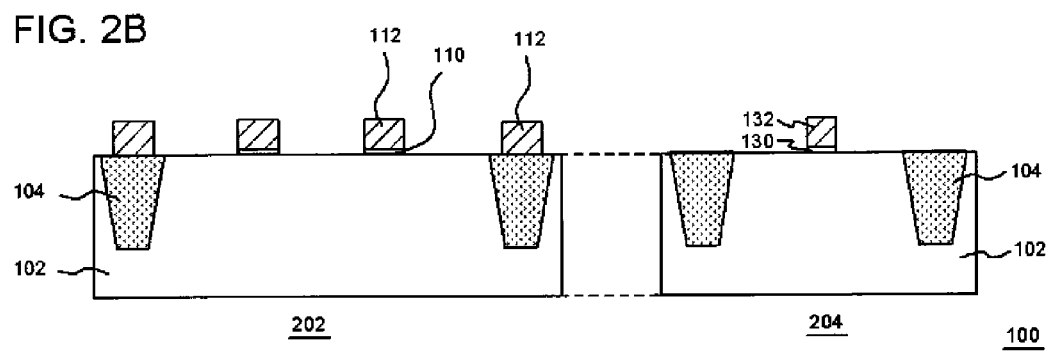

Thereafter, the first gate electrodes 112, the first gate insulating film 110, the second gate electrode 132, and the second gate insulating film 130 are patterned into gate geometries (FIG. 2B).

Figure 3A:
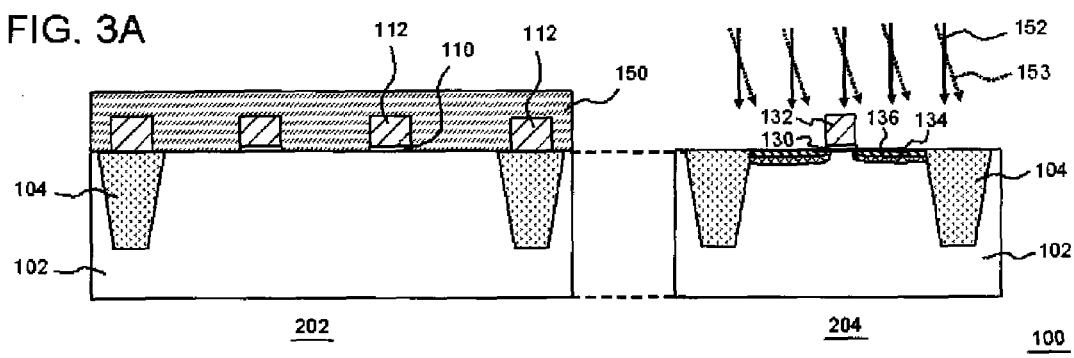

Next, a resist film 150 is formed over the DRAM region 202, and an impurity ion is selectively implanted in the logic region 204. First, the extension regions 136 are formed typically by implanting an n-type impurity ion 152 such as As. Next, the pocket (halo) regions 134 are formed by implanting a p-type impurity ion 153 such as $BF_2$, by angled rotation ion implantation (FIG. 3A). The resist film 150 is then removed.

Figure 3B:
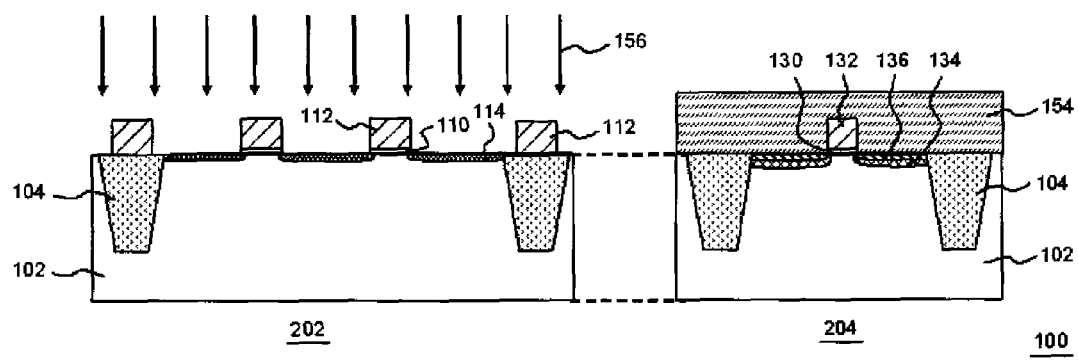

Next, a resist film 154 is formed over the logic region 204, and an n-type impurity ion 156 such as P (phosphorus) is selectively implanted at a low dose into the DRAM region 202, to thereby form LDD (lightly doped drain) regions 114 (FIG. 3B). The resist film 154 is then removed. As one example, the extension regions 136 may have a higher concentration of n-type impurity ion than the LDD regions 114 have.

Next, sidewalls 116 and sidewalls 138 are formed on both sides of the first gate electrodes 112 and the second gate electrode 132, respectively. The sidewalls 116 and the sidewalls 138 may be formed by forming an insulating film such as silicon oxide film or silicon nitride film over the entire surface of the substrate 102, and then by anisotropically etching the film.

Next, an n-type impurity ion is implanted at a high concentration into the DRAM region 202 and the logic region 204, while using the first gate electrodes 112 and the sidewalls 116, and by using the second gate electrode 132 and the sidewalls 138 respectively as masks, to thereby form the first source/drain regions 118 and the second source/drain regions 140 (FIG. 4A). The first source/drain regions 118 and the second source/drain regions 140, explained herein so as to be formed at the same time in the DRAM region 202 and in the logic region 204, may alternatively be formed by separate processes respectively targeted at the individual regions. In such the case, the first source/drain regions 118 and the second source/drain regions 140 may be formed by respectively implanting the impurity ions, while respectively protecting the DRAM region 202 and the logic region 204 using the resist film.

Next, portions of the first source/drain regions 118, the first gate electrodes 112, second source/drain regions 140, and second gate electrode 132 exposed to the surface are subjected to silicidation. The silicidation is carried out typically by forming a metal film of Ti, Co, Ni, NiPt alloy or the like over the entire surface of the substrate 102, followed by annealing. By these processes, a silicide layer 120 is formed on the surface of the first source/drain regions 118, and a silicide layer 122 is formed on the surface of the first gate electrodes 112 in the DRAM region 202; meanwhile a silicide layer 142 is formed on the surface of the second source/drain regions 140, and a silicide layer 144 is formed on the surface of the second gate electrode 132 in the logic region 204 (FIG. 4B). By forming the silicide layer 120 also on the surface of the first source/drain regions 118 in the DRAM region 202, the transistors may be reduced in the electrical resistance, and may be allowed for high speed operation. In this way, the semiconductor device 100 of this embodiment may be formed.

The equivalent oxide thickness T1 of the first gate insulating film 110 of the first transistor 210 and the equivalent oxide thickness T2 of the second gate insulating film 130 of the second transistor 212, which were set equal in the exemplary case described in the above, may alternatively be made different from each other. For example, the equivalent oxide thickness T1 of the first gate insulating film 110 may be thinner than the equivalent oxide thickness T2 of the second gate insulating film 130, and vice versa.

In such the case, the first gate insulating film 110 and the second gate insulating film 130 may be formed, typically according to the procedures described below. First, a gate insulating film is formed in the DRAM region 202 and in the logic region 204, and the gate insulating film is then removed in either region where the equivalent oxide thickness is smaller. Next, another thick gate insulating film is formed in the region from which the gate insulating film was preliminarily removed.

Figure 6:
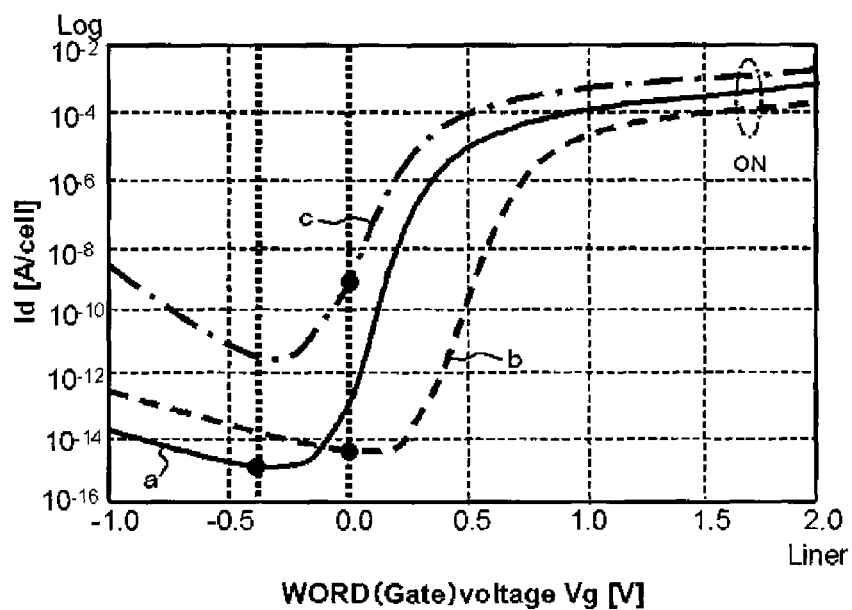
FIG. 6 is a drawing illustrating effects of the semiconductor device according to the embodiment of the present invention.

Next, effects of the semiconductor device 100 of this embodiment will be explained. FIG. 6 is a drawing illustrating effects of the semiconductor device 100 of this embodiment. The semiconductor device used herein was such as having an equivalent oxide thickness T1 of the first transistor 210 of 2.0 nm, and an equivalent oxide thickness T2 of the second transistor 212 of 2.0.

In the drawing, "a", "b" and "c" respectively represents the conditions below:

a (first transistor 210): with silicide layers, without pocket regions, negative bias applied as gate voltage in standby period;

b (first transistor 210): with silicide layers, without pocket regions, gate voltage in standby period=0 V; and c (second transistor 212): with silicide layers, with pocket regions, gate voltage in standby period=0 V.

Results below were obtained for the individual conditions:

a (first transistor 210): low $I_{off}$, improved $I_{ON}$;
b (first transistor 210): low $I_{off}$, high Vt, low $I_{ON}$; and
c (second transistor 212): high $I_{off}$.

As illustrated in FIG. 6, by configuring the first transistor 210 without the pocket regions, $I_{off}$ may be lowered and thereby the retention characteristics necessary for DRAM may be maintained, even if the equivalent oxide thickness T1 of the first gate insulating film 110 of the first transistor 210 in the DRAM region 202 is thinned almost equal to the equivalent oxide thickness T2 of the second gate insulating film 130 of the second transistor 212 in the logic region 204.

Again as illustrated in FIG. 6, $I_{ON}$ may be improved by adjusting the gate voltage of the first transistor 210 in the standby period to a negative bias voltage. It was still also possible in the configuration of the semiconductor device 100 of this embodiment to reduce the word-line voltage, and to thereby reduce the maximum voltage to be applied to the first gate insulating film 110, by adjusting the gate voltage of the first transistor 210 to a negative bias voltage. In this way, a necessary level of breakdown voltage may be ensured, even if the equivalent oxide thickness T1 of the first gate insulating film 110 of the first transistor 210 in the DRAM region 202 is thinned almost equal to the equivalent oxide thickness T2 of the second gate insulating film 130 of the second transistor 212 in the logic region 204. Also the word-line voltage in the peripheral circuit of the DRAM region 202 may be lowered. The lowering in the word-line voltage in the peripheral circuit of the DRAM region 202 also successfully lowers the power consumption of the entire DRAM macro.

Thinning of the equivalent oxide thickness T1 of the first gate insulating film 110 also raises effects of shrinking the gate size, and consequently shrinking the cell size. Since the response (switching characteristics) of the first transistor 210 improves, the S-factor may be improved.

The embodiments of the present invention have been described referring to the attached drawings merely for illustrative purposes, without precluding any other configurations from being adopted.

The n-type transistors explained in the above-described embodiments may be replaced with p-type transistors.

The configuration in the above-described embodiments, having the silicide layer also on the gate electrode, may be replaced by a configuration having a metal gate as the gate electrode, and having the silicide layers only on the source/drain regions.

Still alternatively, also the first transistor 210 may be configured to be applied with zero voltage in the standby period.

Also in this configuration, $I_{off}$ may be lowered as illustrated by curve "b" in FIG. 6, and thereby retention characteristics necessary for DRAM may be maintained.

It is apparent that the present invention is not limited to the above embodiment, and may be modified and changed without departing from the scope and spirit of the invention.

What is claimed is:

1. A semiconductor device having a DRAM region and a logic region embedded therein, comprising:
   a substrate having said DRAM region and said logic region respectively formed thereon;
   a first transistor formed in said DRAM region, and having a first gate insulating film; and
   a second transistor formed in said logic region, and having a second gate insulating film,
   wherein equivalent oxide thickness T1 of said first gate insulating film of said first transistor is not larger than equivalent oxide thickness T2 of said second gate insulating film of said second transistor,
   said second transistor formed in said logic region has, at each end of the source/drain regions thereof, a pocket region which contains an impurity ion having a conductivity type different from a conductivity type of an impurity ion composing said source/drain regions, said first transistor formed in said DRAM region has no pocket region formed at each end of the source/drain regions thereof, and
   at least a part of said pocket region is located in surficial portions of said substrate between the source/drain regions.

2. The semiconductor device as claimed in claim 1, wherein said first transistor is configured to be applied with a negative bias voltage in the standby period.

3. The semiconductor device as claimed in claim 2, wherein said second transistor is configured to be applied with zero voltage in the standby period.

4. The semiconductor device as claimed in claim 1, wherein said source/drain regions of said second transistor formed in said logic region, and said source/drain regions of said first transistor formed in said DRAM region have silicide layers respectively formed in the surficial portions thereof.

5. A semiconductor device having a DRAM region and a logic region embedded therein, comprising:
   a substrate having said DRAM region and said logic region respectively formed thereon;
   a first transistor formed in said DRAM region, and having a first gate insulating film; and
   a second transistor formed in said logic region, and having a second gate insulating film,
   wherein equivalent oxide thickness T1 of said first gate insulating film of said first transistor is smaller than 2.2 nm,
   said second transistor formed in said logic region has, at each end of the source/drain regions thereof, a pocket region which contains an impurity ion having a conductivity type different from a conductivity type of an impurity ion composing said source/drain regions,
   said first transistor formed in said DRAM region has no pocket region formed at each end of the source/drain regions thereof, and
   at least a part of said pocket region is located in surficial portions of said substrate between the source/drain regions.

6. The semiconductor device as claimed in claim 5, wherein said first transistor is configured to be applied with a negative bias voltage in the standby period.

7. The semiconductor device as claimed in claim 6,
wherein said second transistor is configured to be applied with zero voltage in the standby period.

8. The semiconductor device as claimed in claim 5,
wherein said source/drain regions of said second transistor formed in said logic region, and said source/drain regions of said first transistor formed in said DRAM region have silicide layers respectively formed in the surficial portions thereof.

9. A semiconductor device having a DRAM region and a logic region embedded therein, comprising:
a substrate having said DRAM region and said logic region respectively formed thereon;
a first transistor formed in said DRAM region, and having a first gate insulating film and a first gate electrode;
a second transistor formed in said logic region, and having a second gate insulating film and a second gate electrode; and
a negative bias generating circuit applying a negative bias voltage to said first gate electrode,
wherein equivalent oxide thickness T1 of said first gate insulating film of said first transistor is thinner than equivalent oxide thickness T2 of said second gate insulating film of said second transistor,
said negative bias generating circuit applies a negative bias voltage to said first gate electrode in the standby period, and
a dose of impurity ion implanted into a channel region in said DRAM region is lower than a dose of impurity ion implanted into a channel region in said logic region.

10. The semiconductor device as claimed in claim 9,
wherein said second transistor is configured to be applied with zero voltage in the standby period.

11. The semiconductor device as claimed in claim 9,
wherein said source/drain regions of said second transistor formed in said logic region, and said source/drain regions of said first transistor formed in said DRAM region have silicide layers respectively formed in the surficial portions thereof.

12. A semiconductor device having a DRAM region and a logic region embedded therein, comprising:
a substrate having said DRAM region and said logic region respectively formed thereon;
a first transistor formed in said DRAM region, and having a first gate insulating film and a first gate electrode;
a second transistor formed in said logic region, and having a second gate insulating film and a second gate electrode; and
a negative bias generating circuit applying a negative bias voltage to said first gate electrode,
wherein equivalent oxide thickness T1 of said first gate insulating film of said first transistor is smaller than 2.2 nm,
said negative bias generating circuit applies a negative bias voltage to said first gate electrode in the standby period,
the equivalent oxide thickness T1 of said first gate insulating film of said first transistor is thinner than the equivalent oxide thickness T2 of said second gate insulating film of said second transistor, and
a dose of impurity ion implanted into a channel region in said DRAM region is lower than a dose of impurity ion implanted into a channel region in said logic region.

13. The semiconductor device as claimed in claim 12,
wherein said second transistor is configured to be applied with zero voltage in the standby period.

14. The semiconductor device as claimed in claim 12,
wherein said source/drain regions of said second transistor formed in said logic region, and said source/drain regions of said first transistor formed in said DRAM region have silicide layers respectively formed in the surficial portions thereof.

* * * * *